(12) United States Patent
Chen et al.

(10) Patent No.: US 6,872,627 B2
(45) Date of Patent: Mar. 29, 2005

(54) SELECTIVE FORMATION OF METAL GATE FOR DUAL GATE OXIDE APPLICATION

(75) Inventors: Sheng Hsiung Chen, Taichung County (TW); Minghsing Tsai, Taipei (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 503 days.

(21) Appl. No.: 09/905,408

(22) Filed: Jul. 16, 2001

(65) Prior Publication Data

US 2004/0198009 A1 Oct. 7, 2004

(51) Int. Cl.[7] .............................................. H01L 21/336
(52) U.S. Cl. ........................ 438/303; 438/240; 438/241; 438/253; 438/637; 257/905; 257/906; 257/908
(58) Field of Search ................................ 438/240, 241, 438/253, 303, 637; 257/905, 906, 908

(56) References Cited

U.S. PATENT DOCUMENTS

| | | | |
|---|---|---|---|
| 5,960,270 A | 9/1999 | Misra et al. ................ 438/197 |
| 6,043,157 A | 3/2000 | Gardner et al. ............. 438/692 |
| 6,087,231 A | 7/2000 | Xiang et al. ................ 438/287 |
| 6,117,725 A | * 9/2000 | Huang ........................ 438/241 |
| 6,159,782 A | 12/2000 | Xiang et al. ................ 438/197 |

* cited by examiner

*Primary Examiner*—David Nelms
*Assistant Examiner*—Renee R. Berry
(74) *Attorney, Agent, or Firm*—Thomas, Kayden, Horstmeyer & Risley

(57) ABSTRACT

A new processing sequence is provided for the creation of a metal gate electrode. At least two polysilicon gate electrodes are provided over the surface of a substrate, these polysilicon gate electrodes having a relatively thick layer of gate dielectric making these polysilicon gate electrodes suitable for high-voltage applications. The two polysilicon gate electrodes are divided into a first and a second gate electrode, both gate electrodes are imbedded in a layer of Intra Metal Dielectric (IMD). The first gate electrode is removed by applying a lift-off process to this first gate electrode, creating an opening in the layer of IMD. The second gate structure is shielded by a photoresist mask during the removal of the first gate electrode. A metal gate electrode is created in the opening created in the layer of IMD, using a thin layer of gate dielectric.

22 Claims, 5 Drawing Sheets

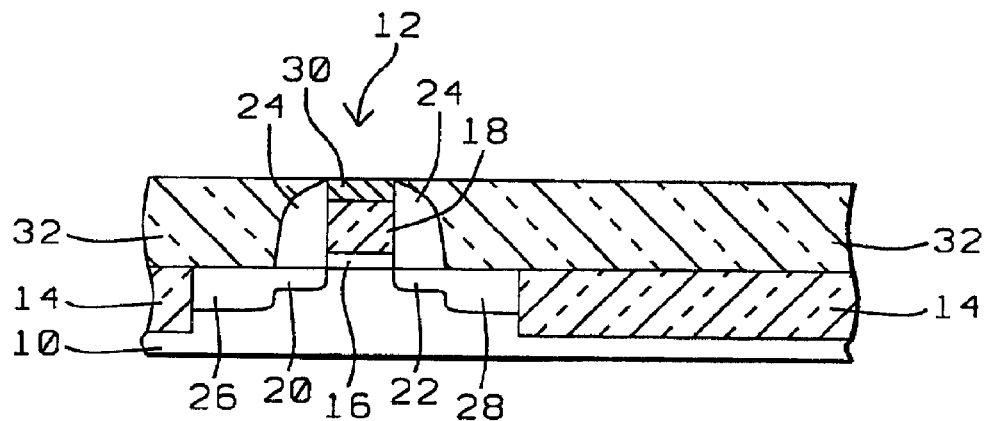
FIG. 1 – Prior Art
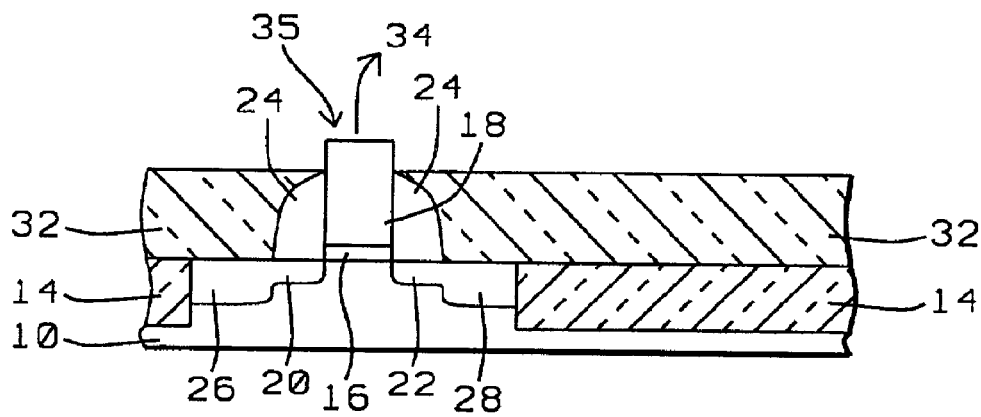
FIG. 2 – Prior Art
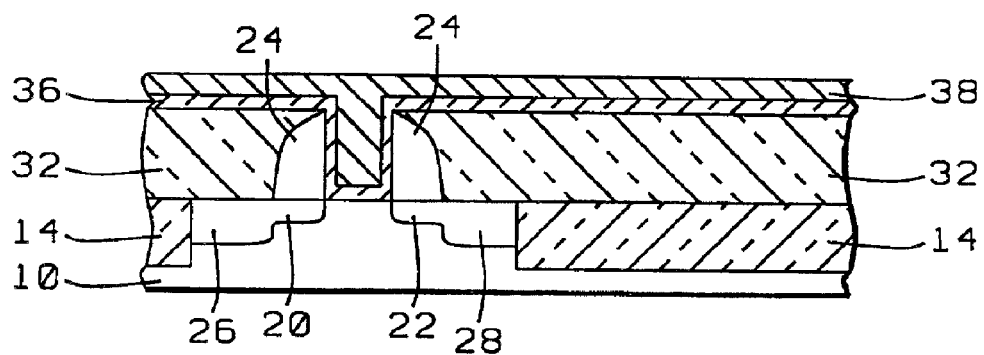
FIG. 3 – Prior Art

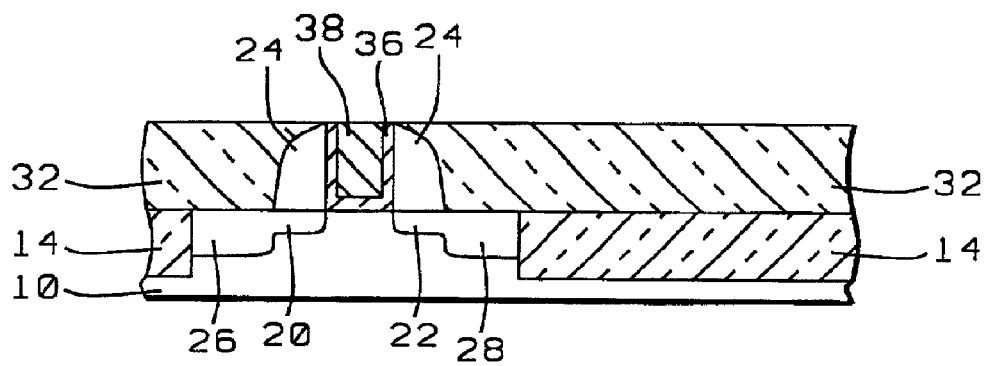
FIG. 4 – Prior Art
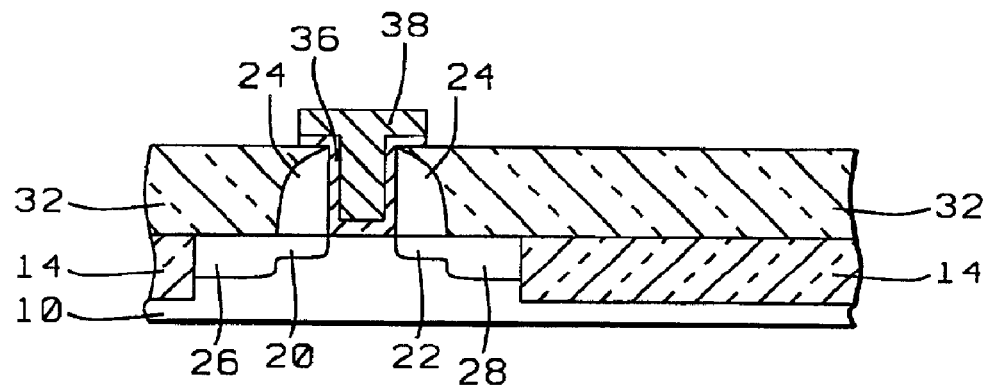
FIG. 5 – Prior Art
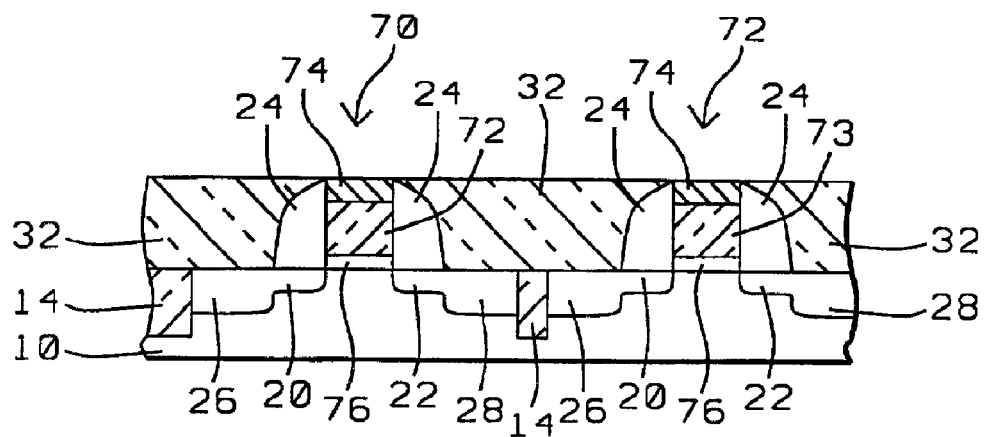
FIG. 6 – Prior Art

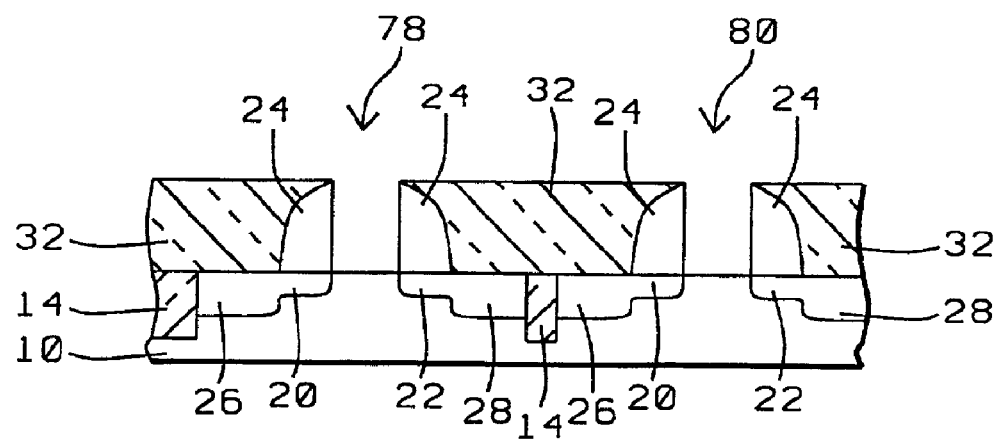
FIG. 7 – Prior Art
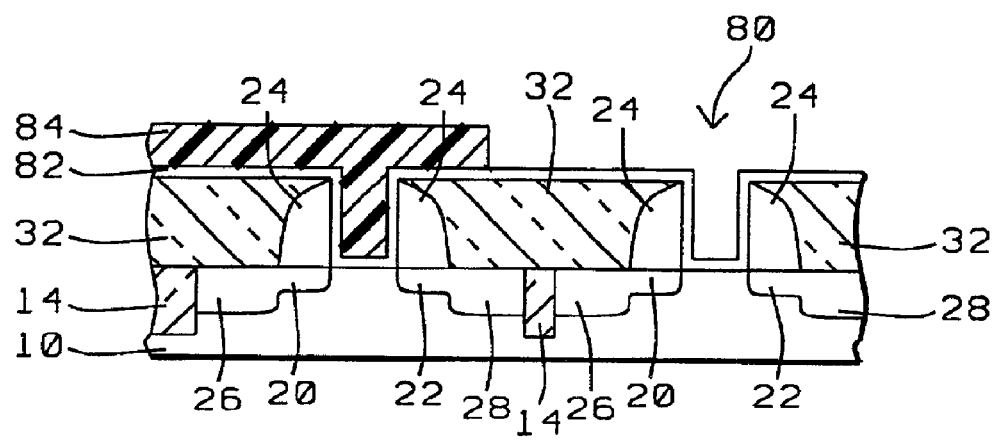
FIG. 8 – Prior Art

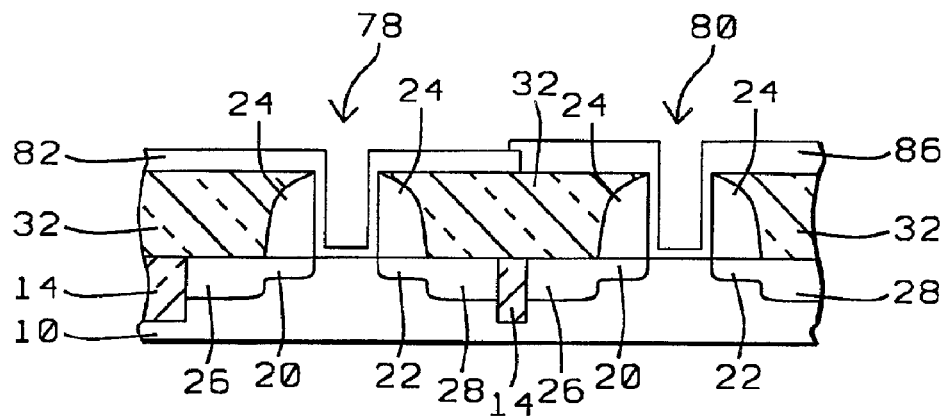
FIG. 9 – Prior Art
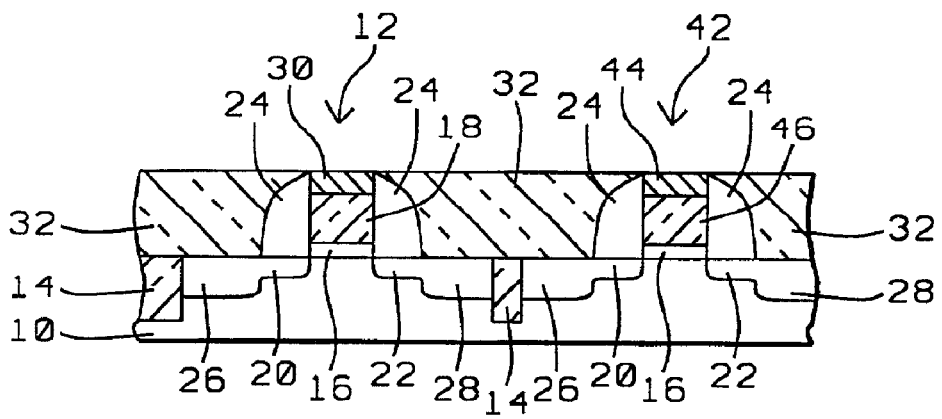
FIG. 10
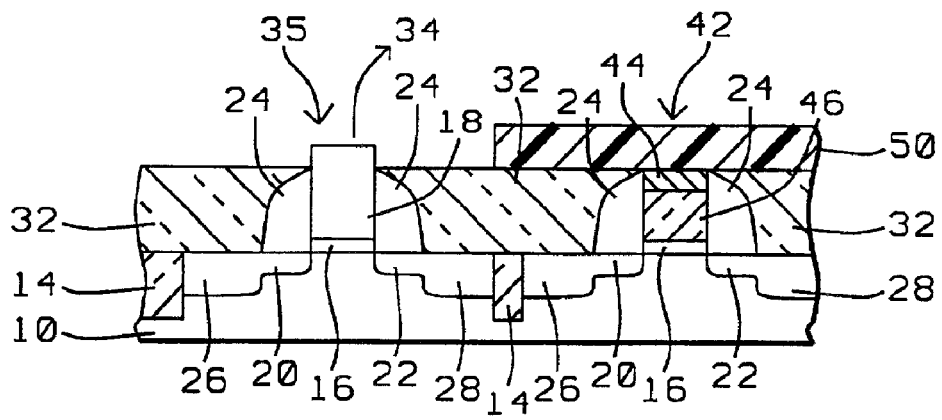
FIG. 11

SELECTIVE FORMATION OF METAL GATE FOR DUAL GATE OXIDE APPLICATION

BACKGROUND OF THE INVENTION (1) Field of the Invention

The invention relates to the fabrication of integrated circuit devices, and more particularly, to a method of selectively forming of low-voltage metal gate electrode in addition to forming a high-voltage polysilicon gate electrode.

(2) Description of the Prior Art

Conventional methods of creating CMOS devices use gate electrodes of polysilicon that is deposited and patterned over a layer of gate oxide. In many applications the surface of the patterned and etched layer of polysilicon is salicided in order to meet requirements of low contact sheet resistivity. With the continued decrease in device and device feature dimensions, the polysilicon of the gate electrode is more prone to depletion of the polysilicon, which results in a significant reduction in device performance. Polysilicon depletion results in increased resistivity of the layer of polysilicon, which in turn results in an increase of the voltage drop across the polysilicon gate electrode when this electrode is reverse mode biased. To address and largely negate this problem and in view of the fact that metal is a good conductor, the industry in increasingly turning to the use of metal to create gate electrodes. Metal however is susceptible to migration to surrounding regions under conditions of elevated temperature that can arise during the process of creating the CMOS device. The gate length of CMOS devices is the distance between the source and the drain regions of the device where this distance extends underneath the gate electrode. With the continued decrease in device dimensions, the gate length for sub-micron devices has been decreased to 0.25 $\mu$m or less. For such small gate length, the control of the Critical Dimension (CD) of this parameter becomes a challenge. To address this aspect of metal gate electrode design, the approach has been provided whereby a dummy gate is first created. This dummy gate uses a dielectric, such as silicon dioxide or a polymer, for the body of the gate. The area surrounding the gate electrode is shielded by the deposition of a layer of for instance oxide, an opening is created in this layer of oxide that aligns with the surface of the gate electrode after which the dummy gate is removed. The opening that is created in this manner can now be filled with new dielectrics first, for instance silicon dioxide or other high-k material, and filled with metal. Polishing of the surface of the deposited metal completes the creation of the sub-micron metal gate electrode.

As previously stated, the integration of metal as the material of choice for the formation of high performance gate electrodes is required in order to reduce the depletion of gate polysilicon. This integration of metal requires a gate replacement process. However, current logic application requires the use of different oxide thicknesses, typically limited to two thicknesses, for the creation of the gate dielectric underlying the gate electrode. Core CMOS applications, which constitute the majority of the CMOS devices that are being created, require high switching speeds, which imposes the requirement of having a thin layer of gate dielectric. Also created however are Input/Output devices, which are required to provide drive currents of relatively large values, which imposes the requirement of having a relatively thick layer of gate dielectric. The requirement of simultaneously creating CMOS devices of different gate dielectric thicknesses may lead to two separate damascene processes whereby each of these two processes provides for one thickness of the gate dielectric. The invention addresses this concern and provides a method for forming a metal gate electrode having a thin layer of gate dielectric, for high-performance application of CMOS devices. The low-voltage metal gate electrode of the invention is created over the surface of a substrate over which high-voltage gate electrodes are simultaneously created.

U.S. Pat. No. 6,087,231 (Xiang et al.) shows a process for a dual gate.

U.S. Pat. No. 6,159,782 (Xiang et al.), U.S. Pat. No. 5,960,270 (Misra et al.) and U.S. Pat. No. 6,043,157 (Gardner et al.) reveal processes for dual gates and dummy gates.

SUMMARY OF THE INVENTION

A principle objective of the invention is to provide a method for creating a metal gate electrode having a thin layer of gate dielectric in an environment where polysilicon gates having different gate dielectric layers are present.

In accordance with the objectives of the invention a new processing sequence is provided for the creation of a metal gate electrode. At least two polysilicon gate electrodes are provided over the surface of a substrate, these polysilicon gate electrodes having a relatively thick layer of gate dielectric making these polysilicon gate electrodes suitable for high-voltage applications. The two polysilicon gate electrodes are divided into a first and a second gate electrode, both gate electrodes are imbedded in a layer of Intra Metal Dielectric (IMD). The first gate electrode is removed by applying a lift-off process to this first gate electrode, creating an opening in the layer of IMD. The second gate structure is shielded by a photoresist mask during the removal of the first gate electrode. A metal gate electrode is created in the opening created in the layer of IMD, using a thin layer of gate dielectric.

BRIEF DESCRIPTION OF THE DRAWINGS

FIGS. 1 through 5 show a prior art method of creating a metal gate electrode, as follows:

FIG. 1 shows a cross section of a semiconductor surface on the surface of which has been formed a polysilicon gate structure, the polysilicon gate structure is embedded in a layer of dielectric.

FIG. 2 shows a cross section of a semiconductor surface where the polysilicon gate structure is removed from the semiconductor surface.

FIG. 3 shows a cross section of a semiconductor surface from the surface of which the polysilicon gate structure has been removed, a layer of high-k dielectric and a layer of metal have been deposited.

FIG. 4 shows a cross section of a semiconductor surface after the deposited layers of high-k dielectric and metal have been polished down to the surface of the layer of dielectric, forming a damascene metal gate structure.

FIG. 5 shows a cross section of a semiconductor surface after the deposited layers of high-k dielectric and metal have been etched, forming an etch back metal gate structure.

FIGS. 6 through 9 describe prior art methods of creating polysilicon gate electrodes having layers of gate dielectric of different thicknesses, as follows:

FIG. 6 shows a cross section of two polysilicon gate electrodes created over the surface of a substrate.

FIG. 7 shows a cross section where the polysilicon and the gate dielectric of the two gate electrodes have been removed.

FIG. 8 shows a cross section after a thin layer of gate dielectric has been universally deposited, the thin layer of gate dielectric overlying a first gate electrode is shielded by the deposition of a layer of developed photoresist.

FIG. 9 shows a cross section where the layer of thin gate dielectric has been removed in accordance with the photoresist mask of FIG. 8, as relatively thick layer of gate dielectric has been deposited, the photoresist mask has been removed from the surface of the substrate.

The invention is described using FIGS. 10 through 13, as follows:

FIG. 10 shows a cross section of a semiconductor surface on the surface of which has been formed a first, dummy polysilicon gate electrode and a second polysilicon gate electrode, the gate electrodes are embedded in a main layer of dielectric.

FIG. 11 shows a cross section of the semiconductor surface of FIG. 10 after a patterned layer of photoresist has been created overlying the main layer of dielectric shielding the second polysilicon gate electrode, the first polysilicon gate structure is being removed from the semiconductor surface, creating an opening in the main layer of dielectric.

Figure 12:
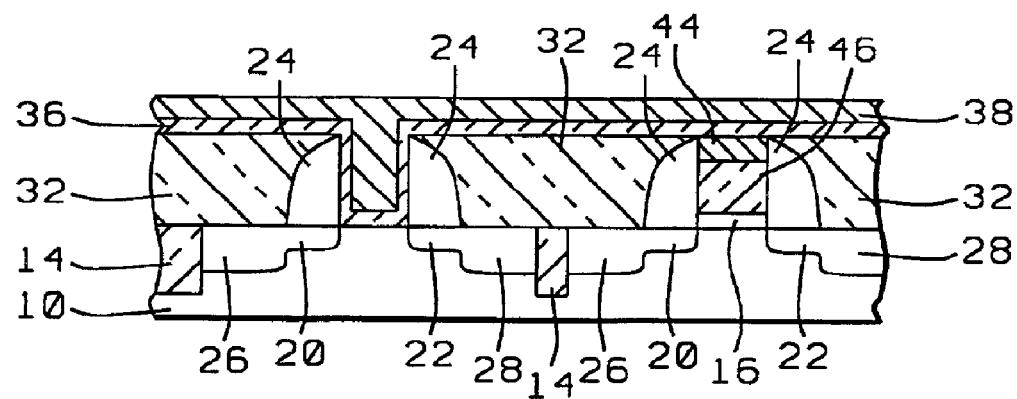

FIG. 12 shows a cross section of the semiconductor surface of FIG. 11 after the patterned layer of photoresist has been removed from above the main layer of dielectric. A layer of high-k dielectric has been deposited over the surface of the main layer of dielectric including the inside surfaces of the opening created in the main layer of dielectric, further including the surface of the second polysilicon gate electrode, a layer of metal has been deposited over the surface of the high-k dielectric.

Figure 13:
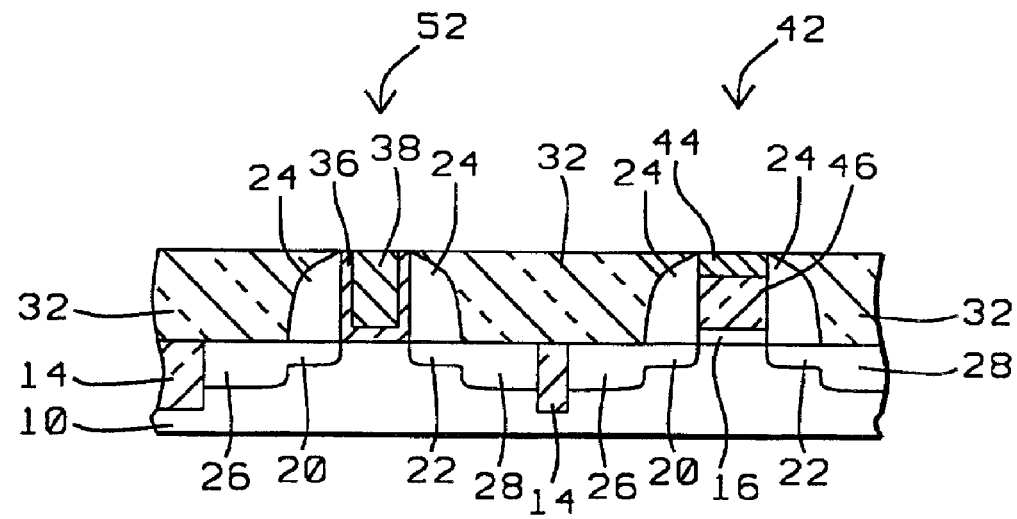

FIG. 13 shows a cross section of the semiconductor surface of FIG. 12 after the layer of high-k dielectric and the layer of metal have been removed from the surface of the main layer of dielectric, leaving in place a metal gate electrode overlying a relatively thin, high-k layer of gate dielectric in addition to a polysilicon gate electrode overlying a relatively thick layer of gate dielectric.

DESCRIPTION OF THE PREFERRED EMBODIMENTS

A brief overview of typical prior art processing steps that are applied for the creation of a metal gate electrode will be presented first. Referring to FIG. 1 there is shown a cross section of a semiconductor surface 10, preferably the surface of a monocrystalline silicon substrate, on the surface of which a gate electrode 12 has been created. Isolation regions 14 have been formed in the surface of surface 10 in order to define and electrically isolate active surface regions in the surface of layer 10. After the regions 14 of for instance Field Oxide (FOX) or of Shallow Trench Isolation (STI) have been created, a layer 16 of pad oxide is created over the surface of substrate 10 by methods of either Chemical Vapor Deposition (CVD) or by exposing the surface of substrate 10 to an oxidizing environment under elevated temperatures.

After the layer 16 of pad oxide has been created, a dummy gate electrode layer 18 is formed by depositing polysilicon. Conventional methods of photolithography and anisotropic etching are applied to the layers 16 of pad oxide and 18 of polysilicon to form the patterned layers 16 and 18 that are shown in cross section in FIG. 1.

Lightly Doped (LDD) source implant 20 and drain implant 22 are performed next that are self-aligned with the gate structure 16/18 and that extend laterally along the surface of substrate 10 in the immediate adjacency of the gate electrode structure 16/18. Dependent on the type of device that is being created, that is a NMOS or a PMOS device, these implants are either n-type or p-type impurities.

Gate spacers 24 are typically formed using materials such as silicon nitride, silicon oxide, BSG, PSG, polysilicon, other materials preferably of a dielectric nature, CVD oxide formed from a TEOS source. Often used materials are amorphous materials that inhibit the deposition of epitaxial silicon thereupon. Spacers can for instance be formed by first depositing a layer of silicon oxide after which an anisotropic RIE procedure is applied using $CHF_3$, $CF_4$ and $H_2$ as an etchant. Gate spacers 24 typically have a thickness of between 300 and 2000 Angstrom.

Source region 26 and drain region 28 are next formed in the surface of substrate 10, self-aligned with the gate spacers 24 of the gate structure 16/18. For NMOS devices, the implants for the source and drain regions use n-type impurities such as arsenic or phosphorous, for PMOS devices a p-type implant such as indium or boron can be used.

The surface of the gate electrode structure 16/18 can next be salicided in order to reduce the contact resistance with the gate electrode. This saliciding of the surface of the gate electrode at the same time salicides the surface regions of the source and drain regions of the gate electrode.

Layer 30 of the gate electrode has been highlighted as being a salicided layer since the process of salicidation can be performed simultaneously with saliciding the source and drain contact points of the gate structure. For the creation of layer 30 tungsten can be applied.

Further shown in cross section in FIG. 1 is the deposition of a blanket layer 32 over the dummy gate electrode 12 and the exposed surface of substrate 10, thereby including the surface of the isolation regions 14. This layer 32 of dielectric, preferably containing silicon dioxide, is deposited to a thickness such that the surface of layer 32 is at least equal to the surface of the salicided layer 30 on the surface of the dummy gate electrode 16/18. Dielectric that has been deposited exceeding this height can be removed by Chemical Mechanical Polishing or by methods of etching. Layer 30 of salicided material is of higher hardness than the surface of the layer 32 of dielectric that is being polished and can therefore serve as a stop layer for the CMP process.

FIG. 2 shows the removal 34 of the dummy gate electrode comprising the layers 16, 18 and 30 from between the gate spacers 24, forming an opening 35 between the gate spacers 24. The dummy gate can be removed using conventional methods of etch. The layer 16 of pad oxide can be removed using $CHF_3/CF_4$ or HF etch chemistry.

Referring now to FIG. 3, a layer 36 of gate dielectric is deposited over the surface of layer 32 and the inside surfaces of opening 35 that has been created between gate spacers 24. Over the surface of the dielectric layer 36 is deposited a layer 38 of metal that is deposited to a thickness sufficient to fill opening 35. The gate electrode can further comprise a barrier layer, copper interconnects should be encapsulated by at least one diffusion barrier to prevent diffusion into the silicon dioxide layer. Silicon nitride is a diffusion barrier to copper, the prior art teaches that copper interconnects should not lie on a silicon nitride layer because it has a high dielectric constant compared with silicon dioxide. The high dielectric constant when applied with interconnects causes an undesired increase in capacitance between the interconnects and the substrate. For the case of a metal gate electrode, a high-k dielectric is required for the metal structure making silicon nitride a desirable dielectric for copper applications.

Referring to FIG. 4, this cross section shows the results that are obtained by polishing layers 38 and 36 down to the surface of the layer 32 of dielectric.

The metal gate electrode that is shown in cross section in FIG. 4 provides a metal gate with a damascene type plug. As an alternate process, the surface of the metal gate electrode can be extended as is shown in cross section in FIG. 5. The metal gate structure that is shown in cross section in FIG. 4 is referred to as a damascene metal gate structure, the metal gate structure that is shown in cross section in FIG. 5 is referred to as an etch back metal gate structure.

FIGS. 6 through 9 briefly highlight the conventional art method of creating polysilicon gate electrodes having different thicknesses for the layer of gate dielectric, as follows:

FIG. 6 shows a cross section of the following new elements:

70 and 72, two polysilicon gate electrodes created over the surface of a substrate 73, the layer of polysilicon that forms the main body of gate electrodes 72 and 74

74, the salicided top surface of gate electrodes 72 and 74

76, the layers of gate dielectric underlying gate electrodes 72 and 74 and forming part of these gate electrodes FIG. 7 shows a cross section where the polysilicon and the gate dielectric of the two gate electrodes 72 and 74 have been removed, creating openings 78 and 80 in the layer 32 of dielectric.

FIG. 8 shows a cross section after a thin layer 82 of gate dielectric has been universally deposited. After the thin layer 82 of gate dielectric has been deposited, the first gate electrode 78 is shielded by the deposition of a patterned and developed layer 84 of photoresist.

FIG. 9 shows a cross section where the layer 82 of thin gate dielectric has been removed in accordance with the photoresist mask 84 of FIG. 8. A relatively thick layer 86 of gate dielectric has been deposited, the photoresist mask 84 has been removed from the surface of the substrate.

At this point in the creation of the two gate electrodes, layers of gate dielectric of different thickness have been provided overlying the inside surfaces of openings 78 and 80. It is from this clear that, by filling openings 78 and 80 with polysilicon, two different gate electrodes are being formed with layers of gate dielectric that are different and that are determined by the thickness of the deposition of the layers 82 and 86 of gate dielectric material.

The processing steps of the invention will now be explained in detail using FIGS. 10 through 13. It must thereby be remembered that it is the objective of the invention to create, overlying the surface of a substrate, a high-voltage polysilicon gate electrode (having a relatively thick layer of gate dielectric) and a low-voltage metal gate electrode (having a relatively thin layer of gate dielectric).

Referring to FIG. 10 there is shown a cross section of a semiconductor surface 10, preferably the surface of a monocrystalline silicon substrate, on the surface of which polysilicon gate electrodes 12 and 42 have been created. The objective of the invention is to create a high voltage I/O CMOS device and a low voltage metal CMOS device. For this purpose, gate electrode 42 will be created as a high voltage I/O CMOS device while gate electrode in location 12 will be created as a low voltage metal CMOS device.

Isolation regions 14 have been formed in the surface of surface 10 in order to define and electrically isolate active surface regions in the surface of layer 10. After the regions 14 of for instance Field Oxide (FOX) or of Shallow Trench Isolation (STI) have been created, a layer 16 of pad oxide is created over the surface of substrate 10 using methods of either Chemical Vapor Deposition (CVD) or by exposing the surface of substrate to an oxidizing environment under elevated temperatures. Typically, a blanket pad oxide can be formed to a thickness of about 150 Angstrom through a thermal oxidation method at a temperature of about 900 degrees C. for a time period of about 10 to 20 minutes. The layer 16 of thin oxide can also be created by applying conventional deposition technology and can, for instance, be deposited using PECVD procedures at a temperature of between about 350 and 450 degrees C. to a thickness between about 125 and 150 Angstrom using TEOS or $SiH_4$ as a source.

Gate electrode 42 that is shown in cross section in FIG. 10 has been created as a high voltage I/O current drive CMOS device and has therefore been provided with a relatively thick layer 16 of pad oxide, that is in the range between about 300 and 600 Angstrom and more preferably about 450 Angstrom.

After the layer 16 of pad oxide has been created, a dummy gate electrode layer 18 and the polysilicon layer 46 are formed by depositing polysilicon to a thickness between about 12000 and 3000 Angstrom over the layer 16 of pad oxide. Conventional methods of photolithography and anisotropic etching are applied to the layers of pad oxide and of polysilicon to form the patterned layers 16, 18 and 46 that are shown in cross section in FIG. 10. Layers 16 and 18 are part of gate electrode 12, layers 16 and 46 are part of the polysilicon gate electrodes 42.

Lightly Doped (LDD) source implants 20 and drain implants 22 are performed next that are self-aligned with the gate structures 12 and 42, these implants extend laterally along the surface of substrate 10 in the immediate adjacency of the gate electrode structures 12 and 42. Dependent on the type of device that is being created, that is a NMOS or a PMOS device, these implants are n-type or p-type impurities that are implanted at an energy of between about 1 KeV and 100 KeV and a density between about $1E12$ atoms/cm$^2$ and $5E15$ atoms/cm$^2$. Spacers 24 are next formed on the sidewalls of the gate structures by a blanket deposition of a suitable gate spacer material followed by an isotropic etch back of the deposited gate spacer material. Gate spacers 24 typically have a thickness of between 300 and 2000 Angstrom.

Source region 26 and drain region 28 are next formed in the surface of substrate 10. For NMOS devices, the implant for the source and drain regions uses n-type impurities such as arsenic or phosphorous, for PMOS devices a p-type implant such as indium or boron can be used. Implant for the source and drain regions are typically performed at an energy of between about 1 KeV and 100 KeV and an impurity concentration of between about $1E15$ atoms/cm$^2$ and $8E15$ atoms/cm$^2$. Impurity implants that have been performed into the surface of the substrate for the creation of source and drain regions can further be activated (further driven into the surface of the substrate) by performing a rapid thermal anneal after the implant has been completed.

The surface of the gate electrode structures 12 and 42 can next be salicided in order to reduce the contact resistance with the gate electrode. This saliciding of the surface of the gate electrodes 12 and 42 also salicides the surface regions of the source (26) and drain (28) regions of the gate electrodes 12 and 42. As an example can be cited the formation of a layer of titanium salicide on the surface of the gate electrodes 12 and 42. A layer of titanium can be deposited over the surface of the substrate to a thickness between about 300 to 600 Angstrom at a temperature of 25 to 300 degrees C. using either rf. sputtering or CVD techniques. A first anneal is performed to the layer of titanium to convert the titanium to the salicided stage. The first anneal is a rapid thermal annealing in a temperature range of between about 600 and 800 degrees C. for a time between about 20 and 40 seconds in a nitrogen ambient. The unreacted titanium is then removed from the surface with an etchback using a wet $NH_4OH$ and $H_2O_2$ solution. A CVD titanium can also be etched using a dry $CF_4$ and oxygen environment. A second anneal can be applied to transform the layer of titanium silicide ($TiSi_2$) over the gate electrode region from the high resistivity phase to the low resistivity phase can be applied. The second anneal is a rapid thermal anneal in a temperature range of between about 800 and 900 degrees C. for a time between 20 and 40 seconds in an $N_2$ ambient.

For the creation of layer 30 and layer 44 tungsten can also be applied. A layer of tungsten can be selectively formed on the surface of the gate electrodes 12 and 42 by CVD deposition at a temperature between about 300 degrees C. and 500 degrees C. and a pressure between about 50 mTorr and 500 mTorr using as source gasses $SiH_4$ and $WF_4$ with a flow ratio of between about 0.1 and 5.0 sccm between these two source gasses.

Further shown in cross section in FIG. 10 is the deposition of a blanket layer 32 of dielectric over the dummy gate electrode 12 and the gate electrode 42 and the exposed surface of substrate 10, thereby including the surface of the isolation regions 14. This layer 32 of dielectric, preferably containing silicon dioxide, is deposited to a thickness such that the surface of layer 32 is at least equal to the surface of the gate structures 12 and 42. Dielectric 32 that has been deposited exceeding this height can be removed by Chemical Mechanical Polishing or by methods of etching.

For layer 32 of dielectric the preferred dielectrics are silicon dioxide (doped or undoped), silicon oxynitride, parylene or polyimide, spin-on-glass, plasma oxide or LPCVD oxide.

It must be noted in the cross section that is shown in FIG. 10 that the layer 16 of gate dielectric, specifically as this layer relates to gate electrode 42, is already formed to the desired thickness so that gate electrode 42 can function as a high-voltage CMOS device.

FIG. 11 shows the deposition of a layer 50 of photoresist, layer 50 has been patterned and developed leaving in place a shielding layer of photoresist overlying the gate structure 42. The process of deposition and developing the layer 50 of photoresist uses conventional methods of photolithography and masking. Layer 50 of photoresist can be etched by applying $O_2$ plasma and then wet stripping by using $H_2SO_4$, $H_2O_2$ and $NH_4OH$ solution. The photoresist that is removed from the surface of the layer 32 of dielectric exposes gate electrode 12.

FIG. 11 further shows the removal 34 of the dummy gate electrode 12 comprising the layers 16, 18 and 30 from between the gate spacers 24, forming an opening 35 between the gate spacers 24 of gate electrode 12. The dummy plug can be removed using conventional methods of etch, using chlorine as a reactant gas to etch the salicided layer 30 and the polysilicon layer 18, assuring that the etch for the removal of these two layers is highly selective to the silicon dioxide of the surrounding layer 32 of dielectric. The layer 16 of pad oxide can be removed using $CHF_3/CF_4$ or HF etch chemistry. Layer 16 of pad oxide can also be etched using $Ar/CF_4$ as an etchant at a temperature of between about 120 and 160 degrees C. and a pressure of between about 0.30 and 0.40 Torr for a time of between about 33 and 39 seconds using a dry etch process.

Referring now to FIG. 12, a layer 36 of high-k gate dielectric is deposited over the surface of layer 32 of dielectric and the inside surfaces of opening 35 that has been created between gate spacers 24 of gate electrode 12. Optionally and prior to the deposition of a layer 36 of high-k dielectric, a layer of gate oxide can be formed on the bottom of the opening that is created in the layer of dielectric by the removal of the dummy gate. Layer 36 of high-k dielectric is preferably deposited to a thickness between about 50 and 150 Angstrom and more preferably to a thickness of about 100 Angstrom.

Over the surface of the high-k dielectric layer 36 is deposited a layer 38 of metal that is deposited to a thickness sufficient to fill opening 35. The metal that is used for layer 38 is composed of a metal selected from the group comprising titanium, tungsten, copper or aluminum or alloys thereof and can be deposited using methods of Plasma Enhanced Chemical Vapor Deposition (PECVD), sputtering or Chemical Vapor Deposition (CVD). The gate electrode can further comprise a barrier layer of a material selected from the group comprising titanium nitride, tantalum, tungsten, niobium, molybdenum, Ti/TiN or Ti/W and is more preferably formed from TiN. Copper interconnects should be encapsulated by at least one diffusion barrier to prevent diffusion into the silicon dioxide layer. Silicon nitride is a diffusion barrier to copper, the prior art teaches that copper interconnects should not lie on a silicon nitride layer because it has a high dielectric constant compared with silicon dioxide. The high dielectric constant when applied with interconnects causes an undesired increase in capacitance between the interconnects and the substrate. For the case of a metal gate electrode, a high-k dielectric is required for the metal structure making silicon nitride a desirable dielectric for copper applications. As examples of materials that can be used for layer 36 can be cited $Si_3N_4$ and $Al_2O_3$ which are dielectric materials with a high dielectric constant ($Si_3N_4$-7.4, $Al_2O_3$-8.5), also oxide-nitride-oxide (ONO), $Si_2O$ and other high dielectric constant material such as tantalum pentoxide ($TaO_5$), titanium oxide ($TiO_2$), zirconium oxide ($ZrO_2$), tantalum oxide ($Ta_2O_5$), barium titanium oxide ($BaTiO_3$) and strontium titanium oxide ($SrTiO_3$).

It must be noted from the cross section that is shown in FIG. 12 that the layer 36 of high-k gate dielectric and the layer 38 of metal can be deposited in the same processing chamber, in-situ and without braking the operational vacuum.

Referring to FIG. 13, this cross section shows the results that are obtained by polishing the surface of layers 38 and 36 down to the surface of the layer 32 of dielectric. Metal gate electrode 52 has at this time been created on the surface of substrate 10 and embedded in the layer 32 of Intra Metal Dielectric. The transition from the cross section that is shown in FIG. 12 to the cross section that is shown in FIG. 13 is achieved by removing excess high-k dielectric layer 36 and the excess metal 38 deposited over the surface of layer 32 of dielectric from the surface of layer 32. This is accomplished by applying Chemical Mechanical Polishing (CMP) to the surface of layers 38 and 36, using the surface of layer 32 as the stop layer.

It is at this point of value to make the observations that the thickness of layer 36 of high-k dielectric can be independently controlled and can therefore be selected to be a relatively thin layer of dielectric. This allows for the creation of a metal gate electrode that can be used for high-performance applications, since this type of a gate typically is required to provide fast switching speeds. The preferred thickness of layer 36 of the invention is between about 50 and 150 Angstrom and more preferably about 100 Angstrom. Further, gate electrode 42 has, during the creation of the I/O metal gate 52, not been affected.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of forming a semiconductor device, comprising the steps of:

forming at least one first transistor and at least one second transistor in an insulating layer on a semiconductor substrate, wherein the first transistor comprises a first gate and a first gate dielectric layer, and the second transistor comprises a dummy gate structure;

removing the dummy gate structure to form an opening exposing the semiconductor substrate;

forming a conformal second gate dielectric layer on interior and bottom surfaces of the opening; and forming a second gate on the second gate dielectric layer to fill the opening.

2. The method of claim 1, wherein the dummy gate structure comprises a dummy polysilicon gate.

3. The method of claim 1, wherein the first gate is a polysilicon gate.

4. The method of claim 3, further comprising forming a salicide layer on a top surface of the polysilicon gate.

5. The method of claim 1, wherein the second gate is a metal gate.

6. The method of claim 5, wherein the metal gate comprises titanium, tungsten, copper or aluminum.

7. The method of claim 1, wherein the first dielectric layer is thicker than the second dielectric layer.

8. The method of claim 1, wherein a thickness of the first dielectric layer is about between 300Å and 600Å.

9. The method of claim 1, wherein a thickness of the second dielectric layer is about between 50Å and 150Å.

10. The method of claim 1, wherein spacers are formed between the dummy gate structure and the insulating layer.

11. The method of claim 1, wherein the second dielectric layer is a high-k dielectric layer comprising silicon nitride ($Si_3N_4$), aluminum oxide ($Al_2O_3$), oxide-nitride-oxide (ONO), silicon oxide ($Si_2O$), tantalum pentoxide ($TaO_5$), titanium oxide ($TiO_2$), zirconium oxide ($ZrO_2$), tantalum oxide ($Ta_2O_5$), barium titanium oxide ($BaTiO_3$) or strontium titanium oxide ($SrTiO_3$).

12. An integrated process of forming a high-voltage transistor and a low-voltage transistor, comprising the steps of:

forming at least one first transistor and at least one second transistor in an insulating layer on a semiconductor substrate, wherein the first transistor comprises a high-voltage gate and a first gate dielectric layer, and the second transistor comprises a dummy gate structure;

removing the dummy gate structure to form an opening exposing the semiconductor substrate;

forming a conformal second gate dielectric layer on interior and bottom surfaces of the opening; and forming a low-voltage gate on the second gate dielectric layer to fill the opening.

13. The integrated process of claim 12, wherein the dummy gate structure comprises a dummy polysilicon gate.

14. The integrated process of claim 12, wherein the high-voltage gate is a polysilicon gate.

15. The integrated process of claim 14, further comprising forming a salicide layer on a top surface of the polysilicon gate.

16. The integrated process of claim 12, wherein the low-voltage gate is a metal gate.

17. The integrated process of claim 16, wherein the metal gate comprises titanium, tungsten, copper or aluminum.

18. The integrated process of claim 12, wherein the first dielectric layer is thicker than the second dielectric layer.

19. The integrated process of claim 12, wherein a thickness of the first dielectric layer is about between 300Å and 600Å.

20. The integrated process of claim 12, wherein a thickness of the second dielectric layer is about between 50Å and 150Å.

21. The integrated process of claim 12, wherein spacers are formed between the dummy gate structure and the insulating layer.

22. The integrated process of claim 12, wherein the second dielectric layer is a high-k dielectric layer comprising silicon nitride ($Si_3N_4$), aluminum oxide ($Al_2O_3$), oxide-nitride-oxide (ONO), silicon oxide ($Si_2O$), tantalum pentoxide ($TaO_5$), titanium oxide ($TiO_2$), zirconium oxide ($ZrO_2$), tantalum oxide ($Ta_2O_5$), barium titanium oxide ($BaTiO_3$) or strontium titanium oxide ($SrTiO_3$).

* * * * *